US007528462B2

(12) United States Patent
Fukuyama et al.

(10) Patent No.: US 7,528,462 B2
(45) Date of Patent: May 5, 2009

(54) ALUMINUM NITRIDE SINGLE-CRYSTAL MULTI-LAYERED SUBSTRATE

(75) Inventors: Hiroyuki Fukuyama, Sendai (JP);
Shinya Kusunoki, Sendai (JP);
Katsuhito Nakamura, Sendai (JP);
Kazuya Takada, Shunan (JP); Akira Hakomori, Shunan (JP)

(73) Assignees: Tokuyama Corporation, Yamaguchi (JP); Tohoku University, Miyagi (JP); Tokyo Institute of Technology, Tokyo (JP)

( * ) Notice: Subject to any disclaimer, the term of this patent is extended or adjusted under 35 U.S.C. 154(b) by 0 days.

(21) Appl. No.: 11/347,236

(22) Filed: Feb. 6, 2006

(65) Prior Publication Data
US 2006/0175619 A1    Aug. 10, 2006

(30) Foreign Application Priority Data
Feb. 7, 2005    (JP)    ............... 2005-031086

(51) Int. Cl.
*H01L 31/032*    (2006.01)
*H01L 31/0368*    (2006.01)
(52) U.S. Cl. ............... 257/613; 257/103; 257/E33.003; 257/E21.121; 117/101
(58) Field of Classification Search ............... 257/79, 257/103, E33.003, E21.121, E21.701, E21.416, 257/190, 352, 507, 613; 438/46; 117/101
See application file for complete search history.

(56) References Cited

U.S. PATENT DOCUMENTS

| 5,741,724 | A  | * | 4/1998 | Ramdani et al. ............... 438/46 |
| 6,673,478 | B2 | * | 1/2004 | Kato et al. ................... 428/698 |
| 6,716,724 | B1 | * | 4/2004 | Iyechika et al. ............. 438/481 |
| 6,744,076 | B2 | * | 6/2004 | Fukuyama et al. .......... 257/103 |
| 2003/0176001 | A1 | | 9/2003 | Fukuyama et al. |
| 2004/0185666 | A1 | | 9/2004 | Fukuyama et al. |
| 2005/0059257 | A1 | * | 3/2005 | Fukuyama et al. .......... 438/725 |

FOREIGN PATENT DOCUMENTS

JP    2004-137142 A    5/2004

OTHER PUBLICATIONS

Slack et al., Journal of Crystal Growth, vol. 34, pp. 263-279 (1976).
Vennegues et al., Applied Physics Letters, vol. 75, No. 26, pp. 4115-4117(1999).

* cited by examiner

*Primary Examiner*—Lynne A. Gurley
*Assistant Examiner*—Colleen Matthews
(74) *Attorney, Agent, or Firm*—Birch, Stewart, Kolasch & Birch, LLP

(57) ABSTRACT

An aluminum nitride single-crystal multi-layered substrate comprising an aluminum nitride single-crystal layer formed by direct reduction nitridation on a single-crystal α-alumina substrate such as a sapphire substrate and an edge-type dislocation layer having a thickness of 10 nm or less in the vicinity of the interface between the both crystals. Threading dislocation is rarely existent in the aluminum nitride single-crystal layer existent on the surface. It is useful as a semiconductor device substrate.

12 Claims, 7 Drawing Sheets

ALUMINUM NITRIDE SINGLE-CRYSTAL MULTI-LAYERED SUBSTRATE

FIELD OF THE INVENTION

The present invention relates to an aluminum nitride multi-layered substrate having an aluminum nitride single-crystal layer on the surface.

DESCRIPTION OF THE PRIOR ART

Much attention has recently been paid to a crystal layer made of a group III nitride semiconductor such as gallium nitride (GaN), aluminum nitride (AlN) or aluminum gallium nitride (AlGaN) as a functional layer constituting a light emitting device such as a light emitting diode (LED) or laser diode (LD) for emitting short-wavelength light in the blue to ultraviolet regions.

To manufacture the semiconductor device, vapor deposition means such as Molecular Beam Epitaxial Grouth Method (MBE) or Metal Organic Vapor Phase Epitaxy (MOVPE) is commonly used to deposit a multi-layer thin film on an α-alumina ($Al_2O_3$) single-crystal (to be also referred to as "sapphire" hereinafter) substrate or the like.

However, high-density defects are introduced in the film forming process due to differences in lattice constant and thermal expansion coefficient between the substrate material and the semiconductor crystal in the above prior art. Since these defects reduce the energy efficiency and service life of the obtained semiconductor device, the development of a substrate material which closely matches the multi-layer film and can avoid the introduction of the above defects is one of the most important objects that will bring a breakthrough in this field.

It is desired that the same kind of a substrate material having a close lattice match for a device comprising a group III nitride-based semiconductor, for example, AlN crystal for an AlGaN crystal layer having a higher concentration of Al should be used as means of attaining the above object.

To obtain the AlN crystal which can be used as an AlGaN-based semiconductor multi-layered substrate, there is known a sublimation and recondensation process in which AlN powders are sublimed into a vapor phase in an extremely high temperature environment at about 2,250° C. and recondensed into seed crystal (G. A. Slack and T. F. Mcnelly, Journal of Crystal Growth, Volume 34, pp. 263, 1976). However, the AlN crystal obtained by the above sublimation and recondensation process is as small as several mm to several tens of mm and therefore not useful as a material for the low-cost mass-production of LED's and LD's.

Then, studies on a large number of techniques for obtaining AlN crystal on the topmost surface by employing vapor deposition such as MBE, MOVPE or Halide Vapor Phase Epitaxy (HVPE) while a lattice mismatch is reduced after a layer such as a group III nitride amorphous layer is preliminarily grown on a sapphire substrate or silicon carbide single-crystal substrate by MBE or MOVPE are now under way. Although it is relatively easy to obtain a large-diameter substrate in these techniques, it is difficult to control small-angle rotation with the c-axis as the axis of rotation in each grain of the AlN thin layer which is oriented in such a manner that its c-axis becomes parallel to the normal line of the substrate face (this orientation will be referred to as "c-axis orientation" hereinafter). Therefore, these techniques have a disadvantage that threading dislocation readily occurs in an association of AlN crystal grains grown from difference nuclei.

The above evaluation is generally carried out with a full width of half maximum of the (ω-mode rocking curve of X-ray Diffractometer (XRD). The term "full width of half maximum of the rocking curve" is the range of ω which is 50% or more of the maximum value of a detection count in a diffraction chart obtained by changing the X-ray incident angle ω while the angle between an X-ray generator and a detector is set to an angle at which a sample satisfies the Bragg diffraction condition. As this value becomes smaller, the crystal quality becomes higher. Although the measurement value of the {0 0 0 2} face perpendicular to the c-axis of AlN is 300 arcsec (3,600 arcsec=1°) or less in the vapor deposition such as MBE, MOVPE or HVPE, it is said that it is difficult to reduce the measurement value of the {1 -1 0 0} face parallel to the c-axis to 1,200 arcsec or less for the above reason.

The four-digit figures within the braces or parentheses in this text indicate a Miller index used for the crystal of a hexagonal system and is expressed as follows by changing a negative index to the original notation. {1 1(overbar) 0 0}->{1 -1 0 0}

Prior to the present invention, the inventors of the present invention developed a process for forming a highly crystalline AlN layer by making use of the reduction nitridation reaction of alumina, carbon (C), nitrogen ($N_2$) and carbon monoxide (CO) as reaction raw materials and proposed it as JP-A 2004-137142. Unlike the prior art in which a target thin layer is deposited on a sapphire substrate, an alumina component is converted into AlN from the surface toward the interior of a sapphire substrate so that aluminum oxinitride (alon) is automatically formed at the interface between these phases and functions as a buffer layer. Therefore, high-quality AlN crystal can be formed.

Consequently, the above object can be expected to be attained by forming a functional layer on the obtained substrate by employing a crystal growth method such as MOVPE or MBE.

Since alon used as a buffer layer in the above proposed technique becomes unstable thermodynamically at 1,630° C. or lower, the substrate must be cooled in as short a time as possible after the reaction, which is a restriction on the industrial-scale manufacture of the substrate. Due to a difference in thermal expansion between layers caused by quenching the three-layer substrate from a high temperature, crystal strain may remain in the AlN layer of interest.

SUMMARY OF THE INVENTION

The present invention has been made to solve the above problems of the prior art.

It is therefore an object of the present invention to provide an AlN single-crystal multi-layered substrate comprising high-quality AlN single-crystal on the surface of a sapphire substrate.

It is another object of the present invention to provide an AlN single-crystal multi-layered substrate which has a large diameter and can be manufactured on an industrial scale.

Other objects and advantages of the present invention will become apparent from the following description.

According to the present invention, the above objects and advantages of the present invention can be attained by a multi-layered substrate which comprises an aluminum nitride single-crystal layer on an α-alumina single-crystal substrate through an edge-type dislocation layer made of Al, N and O.

That is, the inventors of the present invention have kept on with their intensive studies on the method of converting the alumina component into AlN, proposed in JP-A 2004-137142, and have succeeded in the development of a multi-layered substrate having a structure that alon is not existent in a substrate after a reaction and that a lattice mismatch is reduced while a defect at the interface between a single-crystal α-alumina substrate and aluminum nitride single-crystal is prevented from spreading to the both layers.

DETAILED DESCRIPTION OF THE PREFERRED EMBODIMENTS

A preferred embodiment of the present invention will be described in detail hereinunder. A method of directly nitriding the surface of a sapphire substrate will be described hereinbelow for the convenience's sake. However, the method of obtaining the aluminum nitride multi-layered substrate of the present invention is not limited to this.

One of the most efficient means of carrying out the present invention is to form an AlN crystal layer on a sapphire substrate by directly nitriding the surface of the sapphire substrate.

More specifically, the sapphire substrate and graphite are charged into a thermal treatment apparatus and the composition of an $N_2$—CO mixed gas is adjusted to nitride the sapphire substrate in an atmosphere where the oxygen potential and the nitrogen potential are controlled according to the following reaction formulas.

$$Al_2O_3(s) + 3C(s) + N_2(g) \rightarrow 2AlN(s) + 3CO(g) \quad (1)$$

$$\frac{64+x}{3x}Al_2O_3(s) + 3C(s) + N_2(g) = \frac{2}{x}alon(Al_2O_3sat.)(s) + 3CO(g) \quad (2)$$

$$\frac{3}{32-x}alon(AlNsat.)(s) + 3C(s) + N_2(g) = \frac{64+x}{32-x}AlN(s) + 3CO(g) \quad (3)$$

Alon means aluminum oxynitride represented by $Al_{(64+x)/3}\square_{(8-x)/3}O_{32-x}N_x$ ($\square$ is a cation vacancy) and alon($Al_2O_3$sat.) in the above reaction formula (2) means $Al_2O_3$-saturated alon. Alon(AlNsat.) in the reaction formula (3) means AlN-saturated alon. Further, x is a variable for the nonstoichiometry of alon and satisfies 2<x<6.

When the sum $P_{CO}+P_{N2}$ of the nitrogen partial pressure and the carbon monoxide partial pressure constituting the inside atmosphere of a furnace is 1 bar and the activity $a_c$ of carbon is 1, a reaction represented by the reaction formula (1) occurs at a temperature lower than 1,630° C., and reactions represented by the reaction formulas (2) and (3) occur at a temperature of 1,630° C. or higher. When these reactions are expressed by Gibbs energy change formulas, they may be expressed in the form of the sum of the linear expression term of the absolute temperature (standard Gibbs energy changes $\Delta_{r(1)}G°, \Delta_{r(2)}G°, \Delta_{r(3)}G°$) and the RT term in which the nitrogen.carbon monoxide partial pressure ratio is a variable. As the standard Gibbs energy change terms of the reaction formulas are used what are disclosed in "The thermodynamic phase stability of the Al—O—N system and the fabrication of single-crystal AlN using a γ-alon buffer layer" written by Wataru Nakao, doctoral thesis at the Tokyo Institute of Technology, in 2003.

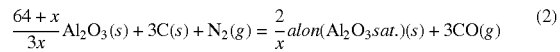

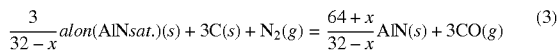

wherein R is a gas constant, T is an absolute temperature, and $a_i$ and $p_i$ are the activities of respective phases.

Figure 1:
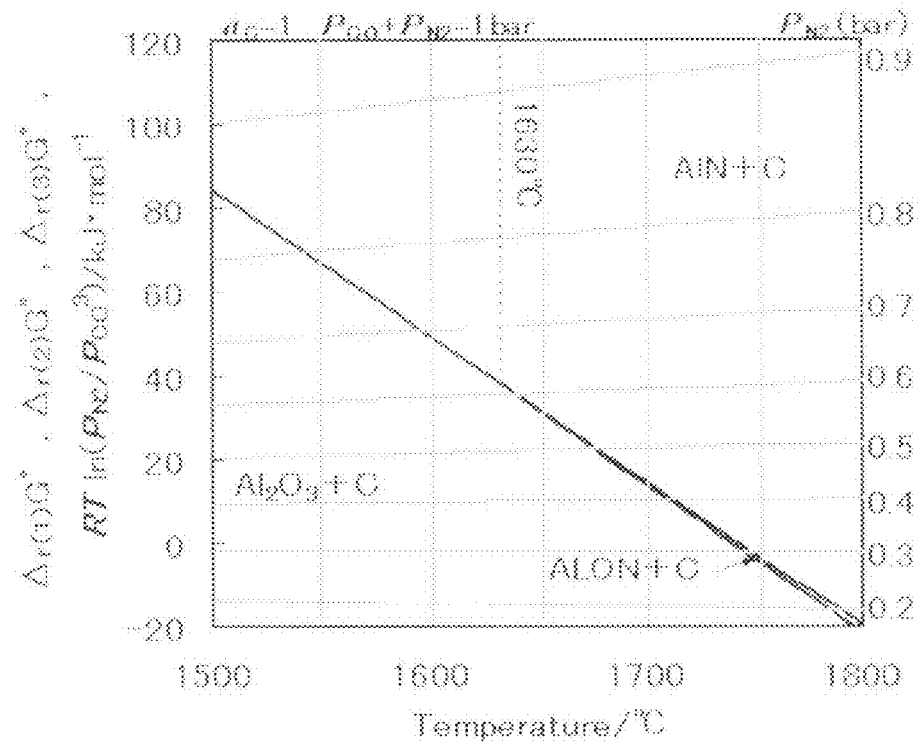
FIG. 1 is an aluminum-oxygen-nitrogen-carbon phase stable diagram.

FIG. 1 is a graph plotting Celsius temperature as the horizontal axis and the quantity of energy as the vertical axis. The straight line descending in a right direction is obtained by connecting the standard Gibbs energy change terms $\Delta_{r(1)}G°$, $\Delta_{r(2)}G°, \Delta_{r(3)}G°$ of three formulas which are determined by temperature. The horizontal lines show equivalent nitrogen partial pressure curves when the total atmospheric pressure is 1 bar. When the energy quantity of the −RT term exceeds the standard Gibbs energy change, the Gibbs energy changes $\Delta_{r(1)}G, \Delta_{r(2)}G, \Delta_{r(3)}G$ of the above reactions become negative and nitridation proceeds. That is, the area above the straight line in FIG. 1 is the stable area of AlN and the area below the straight line is the stable area of $Al_2O_3$. At a temperature of 1,630° C. or higher, the stable area of alon is existent at the boundary between them. A nitridation reaction proceeds by selecting the temperature condition and the composition of the atmosphere corresponding to the stable area of AlN in FIG. 1.

When the substrate is placed in the AlN stable area at 1,630° or higher, the substrate forms the structure of an alon layer-containing nitride substrate proposed in JP-A 2004-137142 through the reactions represented by the formulas (2) and (3). In the present invention, the substrate in this state is cooled to 1,630° C. or lower to be placed in a state where activation energy for making alon unstable thermodynamically and decomposing it into an AlN component and an alumina component is given for a long time. For example, when the thickness of the alon layer is smaller than 20 nm, the cooling rate is reduced to 20° C. or less/min to gradually cool the substrate. The term "cooling rate" herein means a numerical value of a control parameter in a furnace having a common structure and does not mean the precise temperature change of the aluminum nitride multi-layered substrate.

The above method in which the aluminum nitride multi-layered substrate of the present invention is obtained by forming alon at a high temperature and decomposing it during cooling has been described. The formation of alon between the sapphire substrate and the AlN crystal layer is not essential to the acquisition of the multi-layered substrate of the present invention. That is, even when AlN single-crystal is formed by the reaction represented by the reaction formula (1) in the AlN stable area at a temperature lower than 1,630° C., the multi-layered substrate of the present invention is obtained by reducing the cooling rate to 20° C. or less/min, for example, in order to prevent the residual strain produced by a difference in thermal expansion between the sapphire substrate and the AlN crystal layer caused by quenching.

The heating apparatus used in the above method of directly nitriding the surface of the sapphire substrate is not particularly limited and a heating apparatus having any structure may be used. However, it must have the ability of exposing the sapphire substrate to the temperature condition shown in FIG. 1 in a mixed gas of nitrogen and carbon monoxide. It is desired that the apparatus should be designed to keep the temperature difference in the sapphire substrate at 5° C. or less. The heating furnace is desirably made of a material which takes part in the reaction, such as graphite, α-alumina, AlN or alon alone. When a material other than graphite is used in the furnace, as the introducing atmosphere is reducible, a measure is taken to minimize the emission of oxygen or metal vapor. For example, when the furnace is made of α-alumina, it is effective that a heating unit should be placed in the AlN stable area shown in FIG. 1 to nitride the surface of the furnace and then used to manufacture the substrate.

In order to obtain high-quality AlN crystal whose orientation is controlled, the surface of the single-crystal α-alumina substrate in use, i.e., so-called "sapphire substrate" is preferably flat. Therefore, a commonly used sapphire substrate for epitaxial growth is preferably used. To form an AlN single-crystal layer having the feature of the present invention on the surface of this substrate, any face such as the {1 1 –2 0} face (to be referred to as "a-face" hereinafter) or the {0 0 0 1} face (to be referred to as "c-face" hereinafter) is used as the crystal face of the substrate. The a-face is preferably used because the quality of the obtained AlN single-crystal is particularly high.

Various commercially available products of carbon may be used. The purity of the carbon is preferably 99.9% or more, more preferably 99.999% or more. As for the amount of carbon, the weight ratio of carbon to α-alumina in the reaction system is preferably 0.1 or more.

The types of the gases to be introduced are not limited to nitrogen and carbon monoxide. For example, when oxygen is introduced in place of carbon monoxide and reacted with graphite in the furnace to form carbon monoxide for use in the reaction, the same effect as that of the present invention can be obtained.

Gaseous nitrogen and gaseous carbon monoxide are generally used but preferably as highly pure as possible. In general, nitrogen having a purity of 99.9999% or more and carbon monoxide having a purity of 99.9% or more are used. The entry of chemical species such as carbon dioxide and water vapor is prevented as much as possible because an oxygen atom produced by the decomposition of the above chemical species changes the chemical potential of a nitridation reaction to make an erroneous control parameter.

The total pressure of the reaction system is not particularly limited but preferably a value around 1 bar to facilitate the manufacture and operation of the reactor. During the reaction, the mixed gas having predetermined partial pressures is blown at a predetermined rate. The mixing ratio of nitrogen and carbon monoxide is selected from a range which falls in the AlN stable area ($P_{N2}/P_{CO}^3$) changed by the reaction temperature according to the phase stable diagram shown in FIG. 1.

The difference between the value of the –RT term which is determined by the selection of the reaction temperature T and ($P_{N2}/P_{CO}^3$) and the standard Gibbs energy change terms $\Delta_{r(1)}G°$, $\Delta_{r(2)}G°$, $\Delta_{r(3)}G°$ becomes an index for substantial nitridation driving force. This difference corresponds to a distance between the straight line showing standard Gibbs energy changes in FIG. 1 and the coordinates on the vertical axis which are determined from the value of the –RT term by the selected conditions.

To obtain the maximum effect of the direct nitridation reaction, this nitridation driving force must be suitably set. It is desired that the ratio of the mixed gas should be selected such that the nitridation driving force becomes 5 to 30 kJ/mol at 1,750° C., 20 to 100 kJ/mol at 1,675° C. or 30 to 150 kJ/mol at 1,600° C. as examples of the ideal nitridation driving force. When the nitridation driving force falls below the above range, an AlN layer in which two different oriented crystals (domains) are existent is apt to be readily obtained. For example, when a-face sapphire is nitrided under the above conditions, a domain where the AlN{1 –1 0 0} face turns at 30° is produced as shown in Comparative Example 1. Meanwhile, when the nitridation driving force exceeds the above range, a phenomenon that AlN{0 0 0 2} faces almost parallel to a plurality of equivalent crystal faces are produced by the symmetries of sapphire crystals readily occurs, thereby making it difficult to manufacture a single-crystal layer.

As for the flow rate of the mixed gas, a 25° C.·1 atm gas is preferably introduced at a rate of 5 ml/min or more for 1 cm² of the sectional area of the reactor on the plane perpendicular to a gas flow as it is necessary to have a nitrogen atom always reach the surface of the substrate. More preferably, an apparatus for pre-heating the gas to be introduced before it reaches the sapphire substrate is installed. For the partial pressure control of carbon monoxide and nitrogen to be introduced, a commercially available flow meter may be used without restrictions.

Although the heating rate can be set to any value, it is preferably 5° C. or more per minute. The heating time is suitably determined according to the thickness of a desired AlN layer. For example, when an a-face sapphire substrate is nitrided at 1,675° C., a $P_{CO}$ of 0.10 bar and a $P_{N2}$ of 0.90 bar in a heating apparatus whose all components used in heating zone are made of graphite (to be referred to as "graphite furnace" hereinafter), the growth rate of the AlN layer is 5 to 20 nm for 12 hours of a reaction and the growth rate of the alon layer is 5 to 10 nm for 12 hours of a reaction.

To obtain an aluminum nitride multi-layered substrate in the method of directly nitriding the surface of a sapphire substrate, nitridation must be carried out under specific reaction conditions. To carry out nitridation under the above reaction conditions, the reaction temperature, the state of a heating furnace material and the partial pressures of carbon monoxide and nitrogen to be introduced must be always controlled precisely.

The reaction temperature is measured at a position as close to the sapphire substrate as possible. The measuring instrument must eliminate the possibility of mixing impurities into the reaction system. For example, graphite is placed in the vicinity of the sapphire substrate to measure infrared radiation from the graphite with a radiation thermometer.

After the end of the reaction, means of reducing the concentration of carbon monoxide is used to place the substrate in the AlN stable area shown in FIG. 1 during cooling as AlN is oxidized when the substrate falls into the $Al_2O_3$ stable area shown in FIG. 1 during cooling. As an example of this means, the supply of carbon monoxide is suspended before the start of cooling and only nitrogen is supplied continuously to reduce the concentration of carbon monoxide in the reaction system to a value smaller than 0.1%.

As for the cooling rate, the substrate is cooled for a time sufficiently long enough to form a dislocation layer in the vicinity of the interface between sapphire and AlN crystals as described above. To suppress the residual strain caused by a difference in thermal expansion between the sapphire substrate and the AlN crystal layer, a time during which the cooling rate exceeds 20° C./min should be eliminated. At areas of 1,630° C. or lower in the phase stable diagram of FIG. 1, the $Al_2O_3$ stable area is inappropriate because the AlN crystal layer is oxidized in that area as described above. Since activation energy for changing alon into AlN or alumina, or the diffusion rate of atoms is considered as unsatisfactory at a temperature of 1,100° C. or lower, that temperature range is not preferred as a condition for decomposing alon. Therefore, as for the cooling conditions, it is important that the cooling rate should be always kept at 20° C. or lower/min and that a time during which the nitride substrate is kept at a temperature of 1,630° C. to 1,100° C. should be set according to the amount of the produced alon.

The AlN single-crystal layer can be formed on the sapphire substrate through a dislocation layer by the above method and has little influences of strain caused by a lattice mismatch between AlN and sapphire so as to take over crystal perfection inherent to the sapphire substrate. In the AlN single-crystal layer, small angle rotaion with the c-axis of AlN as the axis of rotation in each grain is effectively suppressed unlike the vapor deposition of the prior art. As a result, a crystal lattice mismatch between the sapphire substrate and the AlN single-crystal layer is reduced by the dislocation layer, and the occurrence of threading dislocation which is inevitable in the AlN single-crystal layer formed on the sapphire substrate in the prior art is suppressed.

In a preferred multi-layered substrate of the present invention, the dislocation layer has a thickness of 10 nm or less. In other preferred multi-layered substrate of the present invention, the crystal face of the α-alumina single-crystal substrate is the a-face, the $\{0\,0\,0\,2\}$ face of the aluminum nitride single-crystal is existent at an angle of 1° or less from the a-face of the α-alumina single-crystal, and the crystal orientation of any crystal face of the aluminum nitride single-crystal is 500 arcsec or less.

As described above, the AlN single-crystal layer formed on the AlN single-crystal multi-layered substrate of the present invention is obtained by reducing the concentration of carbon monoxide in the nitrogen.carbon monoxide mixed gas to be introduced into the reactor after the end of the manufacture of a multi-layered substrate having an AlN layer by the nitridation reaction of a sapphire substrate or nullifying the concentration to dilute the concentration of carbon monoxide in the furnace and cooling the substrate over a time long enough to form the dislocation layer in the vicinity of the interface between the both crystals. Unlike the vapor deposition of the prior art, the sapphire substrate is formed in such a manner that it takes over a crystal match inherent to a sapphire substrate. Therefore, a gap with the c-axis of AlN as the axis of rotation is effectively suppressed. As a result, a crystal lattice mismatch between the sapphire substrate and the AlN single-crystal layer is reduced by the dislocation layer and the occurrence of threading dislocation which is inevitable in the AlN single-crystal layer of the prior art can be suppressed. This dislocation layer functions in the same manner as alon in JP-A 2004-137142 and prevents an influence caused by a mismatch between the AlN single-crystal layer and the sapphire substrate. As a result, a high-quality AlN single-crystal layer having measurement values for the $\{0\,0\,0\,2\}$ face perpendicular to the c-axis of AlN and the $\{1\,-1\,0\,0\}$ face parallel to the c-axis of AlN of 500 arcsec or less can be obtained on the topmost surface of the substrate.

Further, as the AlN single-crystal layer on the multi-layered substrate of the present invention is obtained by gradually cooling the substrate after nitridation, the residual strain caused by a difference in thermal expansion between the sapphire substrate and the AlN single-crystal layer rarely occurs.

Since the AlN single-crystal multi-layered substrate of the present invention has an AlN single-crystal layer in which threading dislocation is suppressed on the surface, when it is used as a substrate for an AlGaN-based ultraviolet light emitting device, the improvement of emission intensity and luminous efficiency can be expected. The ultraviolet light emitting device is expected to be used in a light source for sterilization or illumination or a medical laser. Thus, the present invention is of great industrial value.

EXAMPLES

Example 1

A sapphire substrate cut on the a-face (diameter of 500 mm, thickness of 0.4 mm) was nitrided with an $N_2$—CO mixed gas at 1,675° C. by using a Tammann type furnace in which a reaction system was constructed with a graphite heating unit and a support table and gradually cooled to form an AlN single-crystal layer having a dislocation layer as thick as several atom layers at the interface between AlN and sapphire.

The heating unit was cylindrical and laid horizontally and a graphite block mounting the sapphire substrate was placed at the center of the support table having an arcuate bottom corresponding to the inner diameter of the cylindrical heating unit to position the sapphire substrate at the center of the heating unit. Infrared light emitted from this graphite block at the time of heating was measured with a radiation thermometer to control the temperature of the raw material substrate.

The inside of the furnace was evacuated by a rotary pump and substituted with a mixed gas of carbon monoxide having a partial pressure of 0.10 bar and nitrogen having a partial pressure of 0.90 bar, and this atmosphere having the above composition was blown at a fixed rate (2 l/min). The total inside pressure of the furnace was 1 bar. The furnace was heated up to 1,675° C. at a temperature elevation rate of 10° C./min and maintained at that temperature for 12 hours. After the passage of 12 hours, the introduction of carbon monoxide was suspended while the temperature was maintained at 1,675° C., the inside atmosphere of the furnace was substituted with nitrogen by blowing pure nitrogen in an amount 2 times the capacity of the furnace for 30 minutes, and the output of the heater was turned off to cool the furnace naturally.

As for the cooling rate, it took 28 minutes to reduce the temperature from 1,630° C. to 1,100° C. That is, the average cooling rate was 18.9° C./min.

Figure 2:
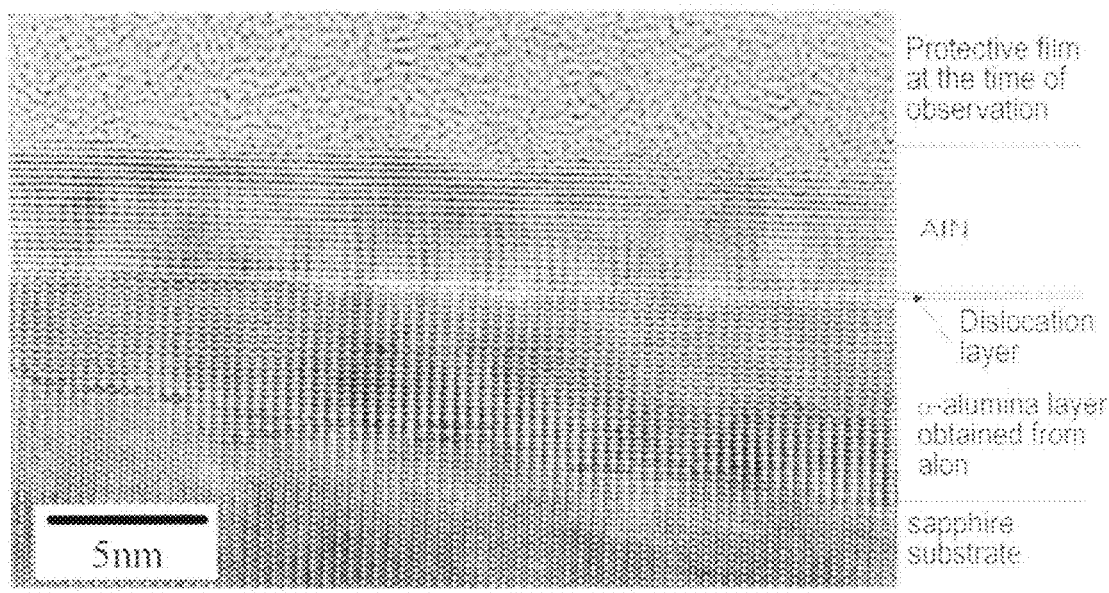
FIG. 2 shows a TEM image of the cross-section of a multi-layered substrate obtained in Example 1.
Figure 3:
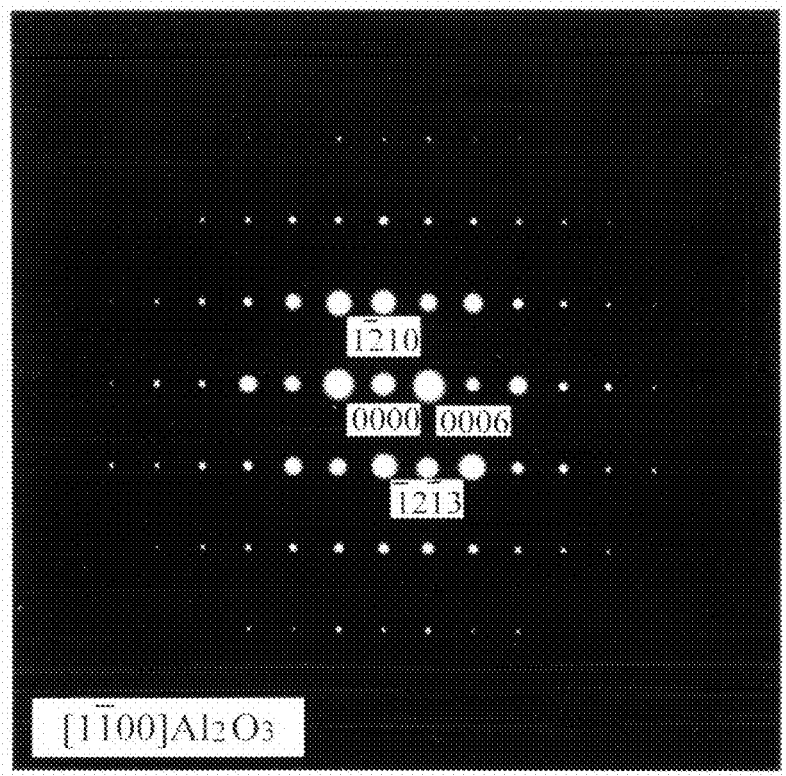
FIG. 3 shows an electron beam diffraction image of the lowermost layer in FIG. 2.
Figure 4:
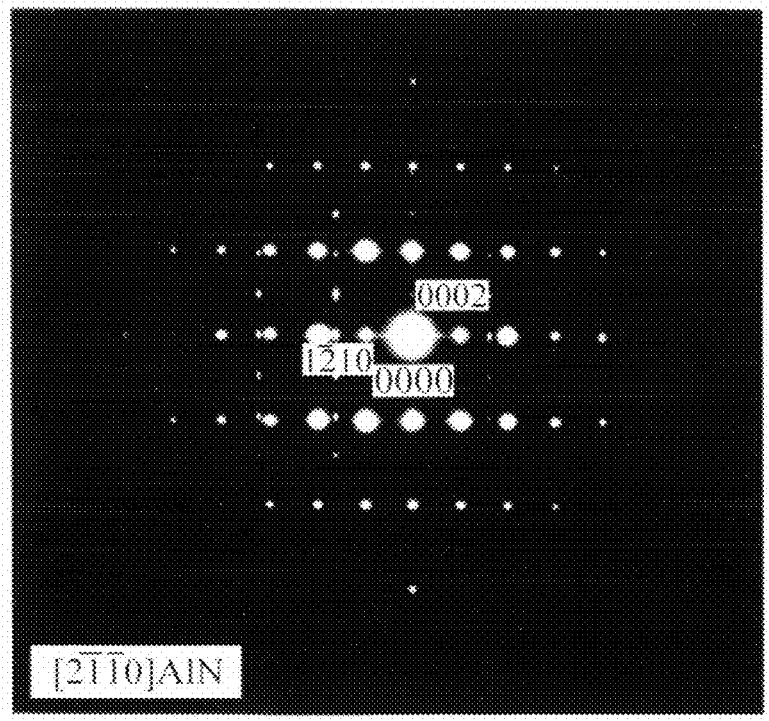
FIG. 4 shows an electron beam diffraction image of the uppermost layer in FIG. 2.

FIG. 2 shows a TEM image of the cross-section of the multi-layered substrate obtained in this example. It is understood from the electron beam diffraction images of FIG. 3 and FIG. 4 that the topmost layer having a thickness of 4 to 5 nm is made of AlN single-crystal, and 2 to 3 atom layers which are bright and underlie the AlN single-crystal, that is, an area having a thickness smaller than 1 nm is a dislocation layer existent in the vicinity of the interface between the AlN single-crystal and the sapphire substrate. In the diffraction image of FIG. 4, as the AlN single-crystal layer is thin, it overlaps with an underlying α-alumina crystal pattern. A mismatching face is seen at a position 4 to 7 nm below the dislocation layer in the sapphire substrate, the area between the dislocation layer and the mismatching face is composed of alon during a nitridation reaction, and it is assumed that alon is returned to the α-alumina component during cooling.

Since there is a mismatch between AlN crystals caused by rotation with the c-axis as the axis of rotation in the AlN crystal layer manufactured by the vapor deposition of the prior art, the boundary between domains having different contrasts is existent parallel to the c-axis of AlN in an association between the both crystals when it is observed under the same conditions. This is called "small angle grain boundary" which is a defect spread to the whole AlN crystal layer and considered as the main cause of so-called "threading dislocation". However, there are no contrasts which can be judged as the above contrasts in the multi-layered substrate fabricated in this example and the small angle tilt grain boundary cannot be observed in the obtained AlN single-crystal. Therefore, the density of defects in the AlN single-crystal is greatly improved.

FIG. 5(A) is a φ scan chart of the AlN{1 –1 0 0} face. X-rays are input by inclining the angle between the X-ray generator and the detector at 0.5° from the horizontal face of the multi-layered substrate obtained in this example as the diffraction angle of AlN{1 –1 0 0} in XRD, and the substrate is turned one time in this state with the normal of the substrate face as the axis of rotation to specify the orientation direction of AlN{1 –1 0 0}. In this chart, a diffraction peak is detected every 60°, which shows that AlN obtained in this example is single-crystal.

When the crystal quality of the AlN single-crystal layer on the topmost surface obtained in this example was evaluated with a full width of half maximum of its ω-mode rocking curve of XRD, the full width of half maximum of the ω-mode rocking curve of the AlN{0 0 0 2} face parallel to the substrate face was 472 arcsec and that of the AlN{1 –1 0 0} face perpendicular to the substrate face was 379 arcsec.

Example 2

A sapphire substrate cut on the a-face was nitrided with an $N_2$—CO mixed gas at 1,675° C. by using a similar apparatus to that of Example 1 and gradually cooled to form an AlN single-crystal layer having a dislocation layer at the interface between AlN and sapphire. A mixed gas having a carbon monoxide partial pressure of 0.30 bar and a nitrogen partial pressure of 0.70 bar was used as the inside atmosphere of the furnace. Other reaction conditions were made the same as in Example 1.

Figure 6:
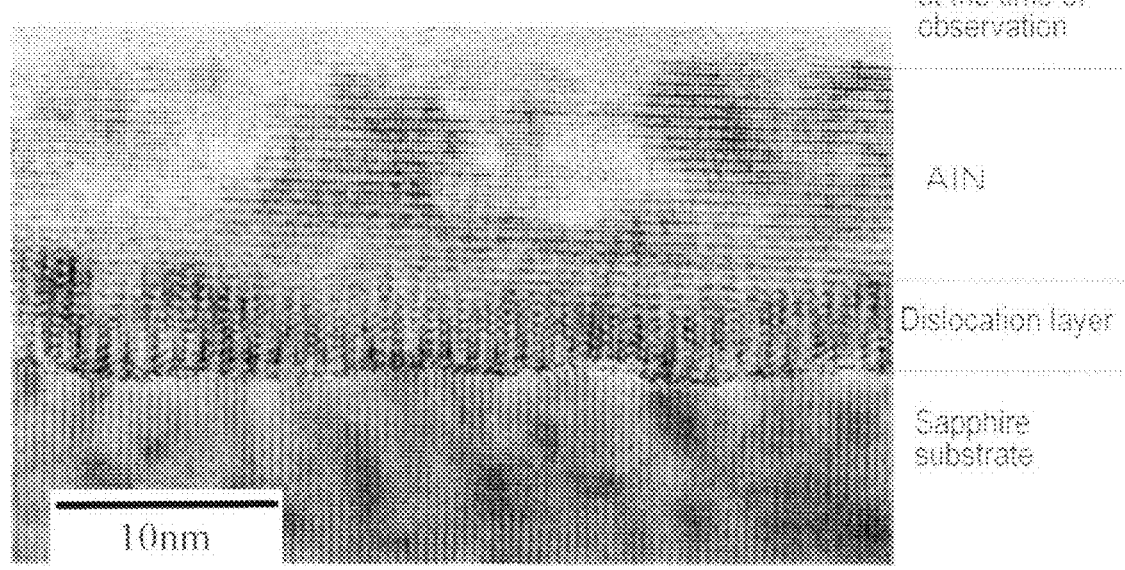
FIG. 6 shows a TEM image of the cross-section of a multi-layered substrate obtained in Example 2.

FIG. 6 shows a TEM image of the cross-section of the multi-layered substrate obtained in this example. The dislocation layer was as thick as 3 to 5 nm and a crystal lattice pattern having periodicity could be observed as compared with the structure of Example 1.

There was no mismatching face on the sapphire substrate side and an α-alumina layer which could be judged to be converted from alon could not be observed.

Figure 7:
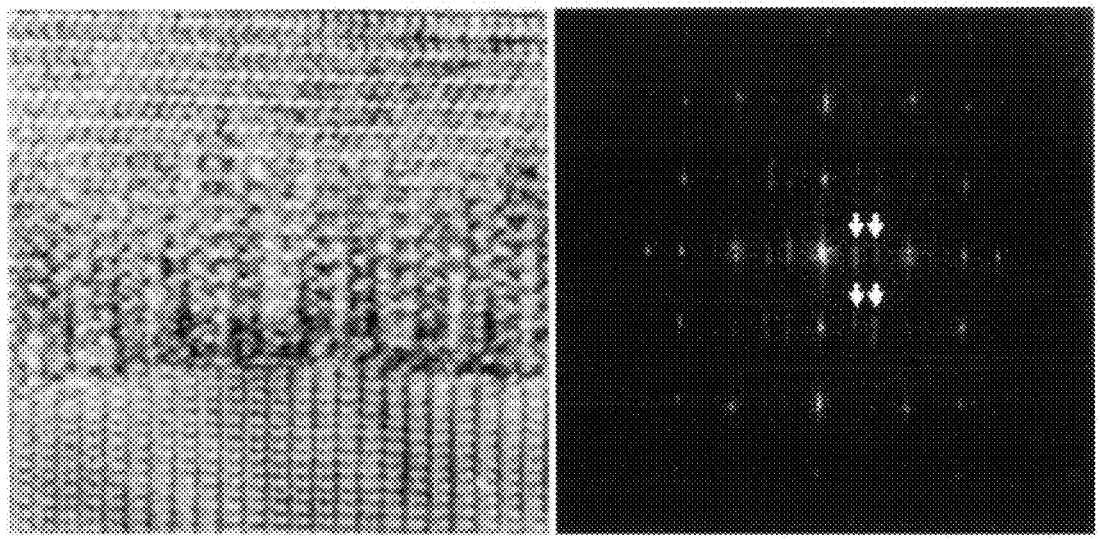
FIG. 7 shows the view field (left) and Fourier transformation pattern (right) of a dislocation layer to be analyzed in the multi-layered substrate obtained in Example 2.
Figure 8:
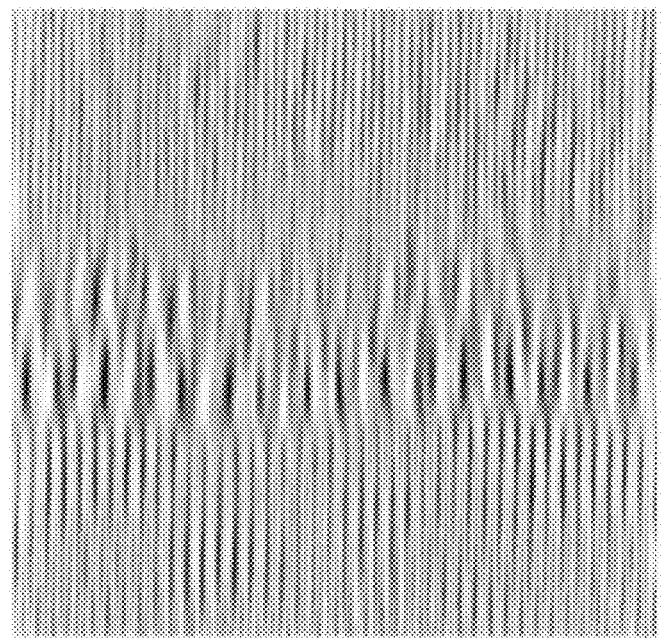
FIG. 8 shows a pattern obtained by the reverse Fourier transformation of a partial horizontal component of the pattern of FIG. 7.

As results of investigation into the structure of the dislocation layer, a Fourier transformation pattern obtained by the Fourier transformation of a lattice image of an area around the dislocation layer is shown in FIG. 7 and an analytical image obtained by the reverse Fourier transformation of a horizontal direction component taken out from part of this pattern is shown in FIG. 8. In FIG. 7, a pattern not corresponding to the AlN single-crystal and the sapphire substrate existent above and below the dislocation layer was observed (shown by arrows in the figure). It could be confirmed from this pattern that the dislocation layer was made of crystal having a face interval of 0.25 nm in a direction perpendicular to the substrate face and face intervals of 0.37 nm and 0.57 nm in the horizontal direction. FIG. 8 shows that edge-type dislocation is produced in the dislocation layer to reduce a crystal lattice mismatch between the AlN single-crystal and the sapphire substrate. Edge-type dislocation as described herein is a linear crystal defect which is produced by a shortage or surplus of the number of atoms to be bonded together when substances which differ in crystal structure or lattice constant from each other are bonded together. Dislocation existent in this dislocation layer does not introduce a defect penetrating the AlN single-crystal layer as a dislocation line and a Burgers vector cross each other basically and become parallel to the interface. The dislocation layers of other examples which differ only in thickness, reduce a crystal lattice mismatch between the AlN single-crystal and the sapphire substrate by the same mechanism as in the dislocation layer of this example.

Example 3

A sapphire substrate cut on the c-face was nitrided with an $N_2$—CO mixed gas at 1,675° C. by using a similar apparatus as in Example 1 and gradually cooled to form an AlN single-crystal layer having a dislocation layer as thick as several atom layers at the interface between AlN and sapphire. All the reaction conditions including the composition of the atmosphere were made the same as in Example 1.

Figure 9:
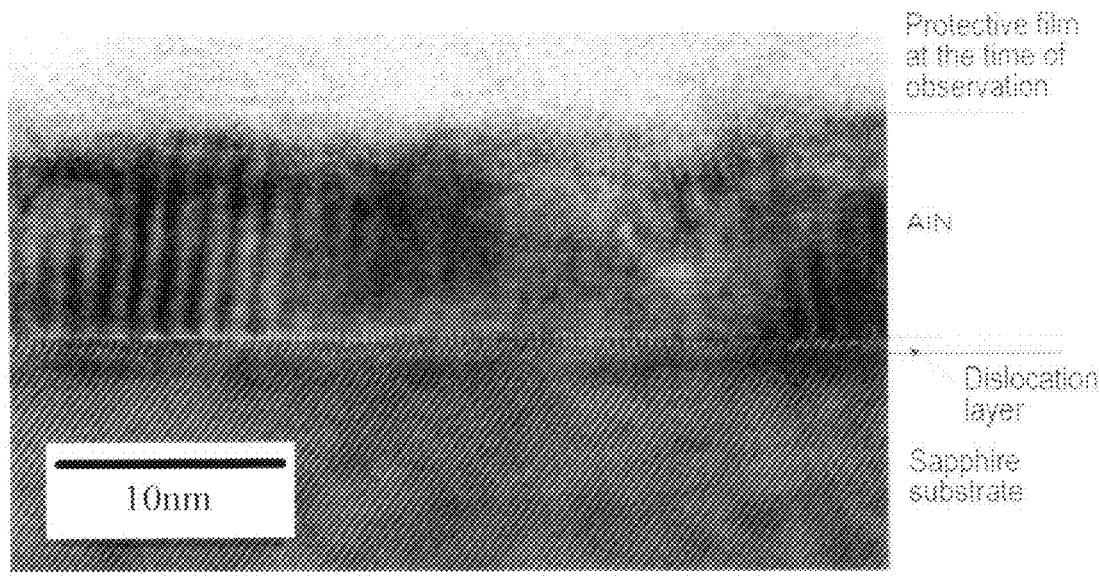
FIG. 9 shows a TEM image of the cross-section of a multi-layered substrate obtained in Example 3.
Figure 10:
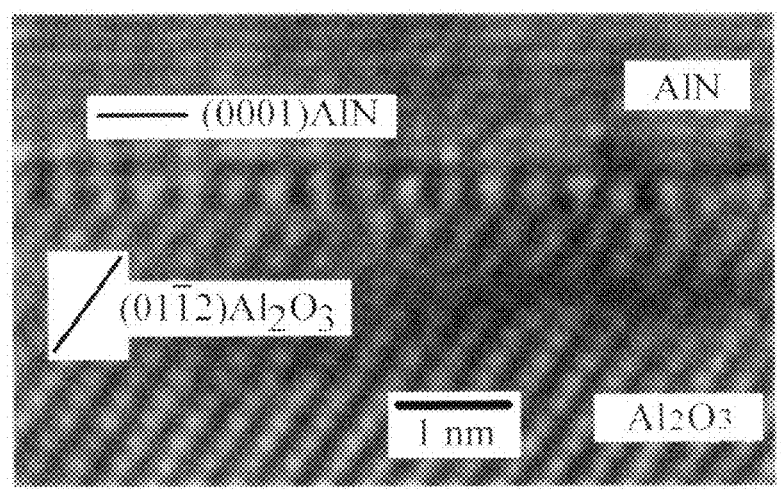
FIG. 10 is an enlarged view of FIG. 9.

FIG. 9 and FIG. 10 show TEM images of the cross-section of the multi-layered substrate obtained in this example. Even when the c-face sapphire was used as a raw material, c-oriented AlN single-crystal was formed through several atom layers, that is, a dislocation layer having a thickness of about 1 nm. There was no trace of a defect spread to the AlN single-crystal and the sapphire substrate like the multi-layered substrate of Example 1.

When the crystal quality of the AlN single-crystal layer on the topmost surface obtained in this example was evaluated with a full width of half maximum of its ω-mode rocking curve of XRD, the full width of half maximum of the ω-mode rocking curve of the AlN{0 0 0 2} face parallel to the substrate face was 1,260 arcsec and that of the AlN{1 –1 0 0} face perpendicular to the substrate face was 1,584 arcsec.

Example 4

A sapphire substrate cut on the a-face was nitrided with an $N_2$—CO mixed gas at 1,600° C. by using a similar apparatus as in Example 1 and gradually cooled to form an AlN single-crystal layer having a dislocation layer as thick as several atom layers, that is, a thickness smaller than 1 nm at the interface between AlN and sapphire.

As the inside atmosphere of the furnace, a mixed gas having a carbon monoxide partial pressure of 0.10 bar and a nitrogen partial pressure of 0.90 bar was used. Other reaction conditions were made the same as in Example 1. As for the cooling rate, it took 30 minutes to reduce the temperature from 1,600° C. to 1,100° C. and the average cooling rate was 16.7° C./min.

It was confirmed that the sectional structure of the multi-layered substrate obtained in this example was the same as in Example 1. When the crystal quality of the AlN single-crystal layer on the topmost surface was evaluated with a full width of half maximum of its ω-mode rocking curve of XRD, the full width of half maximum of the ω-mode rocking curve of the AlN{0 0 0 2} face parallel to the substrate face was 436 arcsec and that of the AlN{1 –1 0 0} face perpendicular to the substrate face was 415 arcsec.

Comparative Example 1

A sapphire substrate cut on the a-face was nitrided with an $N_2$—CO mixed gas at 1,600° C. by using a similar apparatus as in Example 1 under the condition that the above nitridation driving force was smaller than an appropriate value and gradually cooled to form an AlN single-crystal layer having a dislocation layer as thick as several atom layers at the interface between AlN and sapphire. As the inside atmosphere of the furnace, a mixed gas having a carbon monoxide partial pressure of 0.25 bar and a nitrogen partial pressure of 0.75 bar was used. Other operation conditions were made the same as in Example 1.

As for the cooling rate, it took 30 minutes to reduce the temperature from 1,600° C. to 1,100° C. and the average cooling rate was 16.7° C./min.

Figure 11:
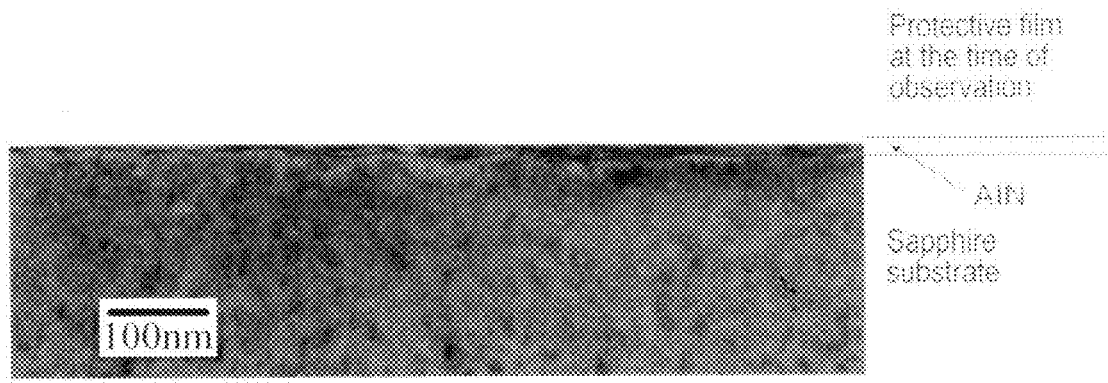
FIG. 11 shows a TEM image of the cross-section of a multi-layered substrate obtained in Comparative Example 1.

FIG. 11 shows a TEM image of the cross-section of the multi-layered substrate obtained in this comparative example. AlN crystals as thick as 5 to 20 nm were formed and the structure of the interface between it and the sapphire substrate was almost the same as in Example 1.

Figure 5:
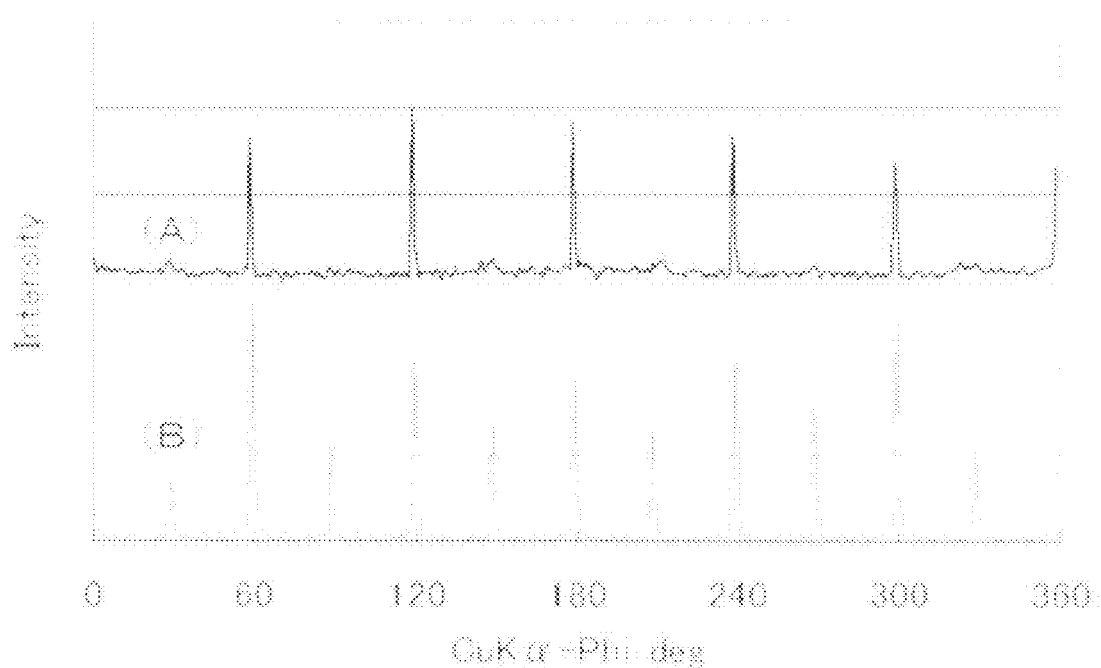
FIG. 5(A) is a φ scan chart showing the orientation direction of the AlN{1 −1 0 0} face in Example 1 and FIG. 5(B) is a φ scan chart showing the orientation direction of the AlN{1 −1 0 0} face in Comparative Example 1.

However, as shown in the φ scan chart of the AlN{1 –1 0 0} face by XRD shown in (B) of FIG. 5, crystals turned at 30° are existent in the AlN crystals and do not satisfy the requirement for single-crystal. This is because an aluminum atom layer and an oxygen atom layer were existent on the topmost surface of the unreacted sapphire substrate and AlN crystals began to grow in directions corresponding to these atom layers as the nitridation driving force was as small as 11 kJ/mol.

Comparative Example 2

A sapphire substrate cut on the a-face was nitrided with an $N_2$—CO mixed gas at 1,750° C. by using a similar apparatus as in Example 1 and cooled at almost the same cooling rate as in Example 1 to form an AlN layer having the residual alon layer at the interface between AlN crystal and sapphire. As the inside atmosphere of the furnace, a mixed gas having a carbon monoxide partial pressure of 0.60 bar and a nitrogen partial pressure of 0.40 bar was used. The operation conditions were made the same as in Example 1. As for the cooling rate, it took 27 minutes to reduce the temperature from 1,630° C. to 1,100° C. and the average cooling rate was 19.6° C./min.

Figure 12:
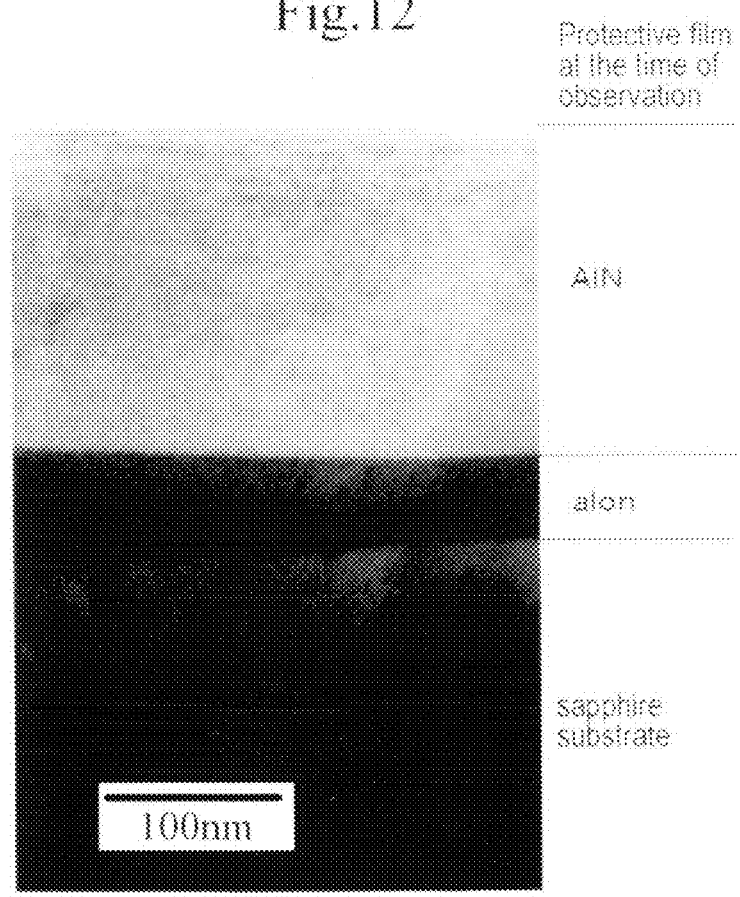
FIG. 12 is a TEM image of the cross-section of a multi-layered substrate obtained in Comparative Example 2.
Figure 13:
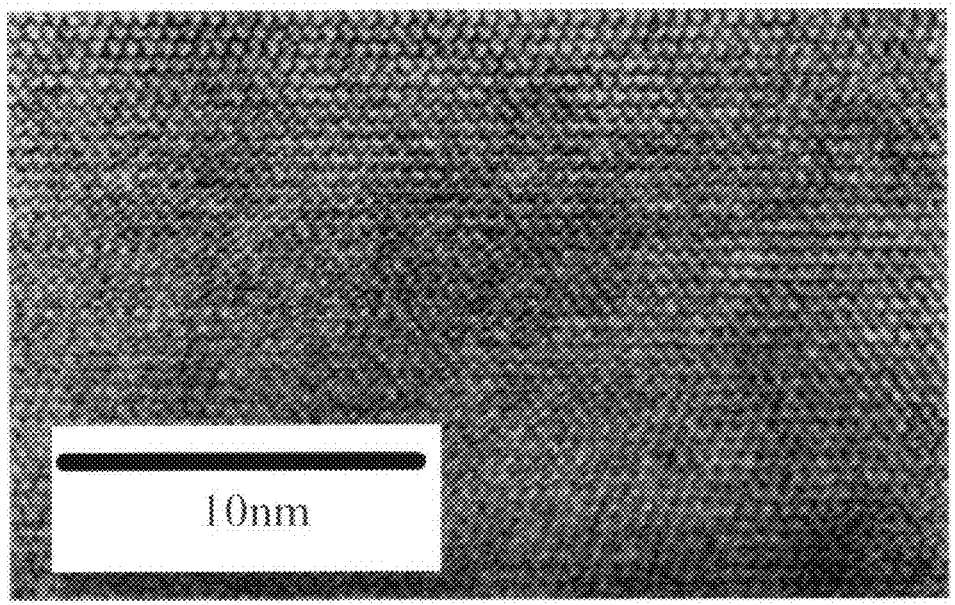
FIG. 13 shows a lattice image of an alon layer in FIG. 12.

FIG. 12 and FIG. 13 show TEM images of the cross-section of the obtained reacted multi-layered substrate. Since the nitridation reaction rate was high at 1,750° C., alon grew 60 to 80 nm and the amount of the decomposed alon was very small under the same cooling conditions as in Example 1 and remained almost unchanged. Its lattice image completely differs from those of other examples. That is, in this comparative example, the multi-layered substrate of the present invention cannot be obtained unless the total amount of alon is decomposed into AlN and alumina by further reducing the cooling rate from 1,630° C. to 1,100° C. according to the amount of the produced alon.

When the crystal quality of the AlN crystal layer on the topmost surface was evaluated with a full width of half maximum of its ω-mode rocking curve of XRD, the full width of half maximum of the ω-mode rocking curve of the AlN{0 0 0 2} face parallel to the substrate face was 828 arcsec and that of the AlN{1 –1 0 0} face perpendicular to the substrate face was 2,196 arcsec.

What is claimed is:

1. A multi-layered substrate comprising an aluminum nitride single-crystal layer which is laminated directly on an α-alumina single-crystal substrate through an edge-type dislocation layer made of Al, N and O, wherein the crystal lattice mismatch between the α-alumina single-crystal substrate and the aluminum nitride single-crystal layer is reduced by the dislocation layer, and wherein alon, which is aluminum oxynitride represented by $Al_{(64+x)/3}\square_{(8-x)/3}O_{32-x}N_x$ (wherein $\square$ is a cation vacancy and 2<x<6), is not present in the multi-layered substrate after a reaction between the aluminum nitride single-crystal layer and the α-alumina single-crystal substrate.

2. The multi-layered substrate according to claim 1, wherein the edge-type dislocation layer has a thickness of 10 nm or less.

3. The multi-layered substrate according to claim 1 or 2, wherein the crystal face of the α-alumina single-crystal substrate is an a-face, the {0 0 0 2} face of the aluminum nitride single-crystal is existent at an angle of 1° or less from the a-face of the α-alumina single-crystal, and the crystal orientation of any crystal face of the aluminum nitride single-crystal is 500 arcsec or less.

4. The multi-layered substrate of claim 1, wherein the edge-type dislocation layer made of Al, N and O is formed at a high temperature and subsequently decomposed into an AlN component and an alumina component during cooling.

5. The multi-layered substrate of claim 1, wherein the surface of the α-alumina single-crystal substrate is flat.

6. The multi-layered substrate of claim 1, wherein the crystal face of the α-alumina single-crystal substrate is the {0 0 0 1} or c-face.

7. A multi-layered substrate comprising:
a sapphire substrate;
a dislocation layer made of Al, N and O; and
an aluminum nitride single-crystal layer laminated directly on the substrate through the dislocation layer, wherein an edge-type dislocation is produced in the dislocation layer to reduce a crystal lattice mismatch between the aluminum-nitride single crystal and the sapphire substrate.

8. The multi-layered substrate of claim 7, wherein small angle rotation with the c-axis in the aluminum nitride single-crystal layer is suppressed.

9. The multi-layered substrate of claim 7, wherein the dislocation layer has a thickness of 10 nm or less.

10. The multi-layered substrate of claim 7, wherein the aluminum nitride single-crystal layer is obtained by nitridation of the sapphire substrate and gradual cooling of the substrate after nitridation.

11. An AlGaN-based ultraviolet light emitting device comprising the multi-layered substrate of claim 7.

12. The multi-layered substrate of claim 7, wherein the dislocation layer comprises a crystal having a face interval of 0.25 nm in a direction perpendicular to the substrate face.

* * * * *